United States Patent
Uka (10) Patent No.: US 7,448,923 B2
(45) Date of Patent: Nov. 11, 2008

(54) CONNECTION FOR FLEX CIRCUIT AND RIGID CIRCUIT BOARD

(76) Inventor: Harshad K Uka, 1301 E. Hunter Ave., Santa Ana, CA (US) 92705

( * ) Notice: Subject to any disclaimer, the term of this patent is extended or adjusted under 35 U.S.C. 154(b) by 0 days.

(21) Appl. No.: 11/562,905

(22) Filed: Nov. 22, 2006

(65) Prior Publication Data

US 2008/0139011 A1   Jun. 12, 2008

Related U.S. Application Data

(60) Provisional application No. 60/844,816, filed on Sep. 14, 2006.

(51) Int. Cl.
  *H01R 4/02* (2006.01)
(52) U.S. Cl. .................. 439/876; 439/67; 174/88 R; 361/758
(58) Field of Classification Search .............. 439/67, 439/83, 74, 64, 876, 721, 904, 75; 361/742, 361/804, 758; 174/88 R
  See application file for complete search history.

(56) References Cited

U.S. PATENT DOCUMENTS

| | | | |
|---|---|---|---|
| 3,541,225 A | 11/1970 | Raciti | |
| 3,905,665 A * | 9/1975 | Lynch et al. | 439/62 |
| 4,394,712 A | 7/1983 | Anthony | |
| 5,132,879 A | 7/1992 | Chang et al. | |
| 5,570,504 A | 11/1996 | DiStefano et al. | |
| 5,617,300 A | 4/1997 | Anzawa et al. | |
| 5,688,584 A | 11/1997 | Casson et al. | |
| 5,896,276 A | 4/1999 | Tamura et al. | |
| 6,347,042 B1 * | 2/2002 | White | 361/784 |
| 2001/0053068 A1 * | 12/2001 | Murayama et al. | 361/760 |

OTHER PUBLICATIONS

Patent Cooperation Treaty. International Search Report. International Application No. PCT/US2007/019969. 12 pages.

* cited by examiner

*Primary Examiner*—Renee S Luebke
*Assistant Examiner*—Harshad C Patel
(74) *Attorney, Agent, or Firm*—Stetina Brunda Garred & Brucker (57) ABSTRACT

Conductive pads of a flex circuit may be electrically connected to conductive pads of a rigid circuit board. The conductive pads of the flex circuit may be sized, configured and alignable to the conductive pads of the rigid circuit board. A spacer with a plurality of apertures may be sized, configured and aligned to the conductive pads of the flex circuit and the rigid circuit board. Solder paste may be disposed between respective conductive pads of the flex circuit and the rigid circuit board within the apertures of the spacer. When the flex circuit, rigid circuit board and the spacer are assembled, the solder paste is displaced through relief vents formed through the conductive pads of the flex circuit, rigid circuit board or both the flex circuit or rigid circuit board. The solder paste is reflowed and forms a rivet structure attaching the flex circuit to the rigid circuit board as well as providing an electrical connection between the conductive pads of the flex circuit and the rigid circuit board.

23 Claims, 4 Drawing Sheets

CONNECTION FOR FLEX CIRCUIT AND RIGID CIRCUIT BOARD

CROSS-REFERENCE TO RELATED APPLICATIONS

This application claims the benefits of U.S. Provisional Patent Application No. 60/844,816, filed on Sep. 14, 2006, the entire contents of which is incorporated herein by reference.

STATEMENT RE: FEDERALLY SPONSORED RESEARCH/DEVELOPMENT

Not Applicable

BACKGROUND

The present invention relates to a connection between circuit boards.

In electrical devices, two rigid circuit boards may be electrically connected to each other via a flex circuit. Such connection is typically made in electrical devices such as hand held personal digital assistants (i.e., PDAs). For example, the display (e.g., first rigid circuit board) of the PDA may be in electrical communication with a motherboard (e.g., second rigid circuit board) via a flex circuit.

Prior art connections between the flex circuit and rigid circuit boards may include rigid flex, lap solder joint, connector, anisotropic film bonding, hot bar process, support free leads, or header pin. Unfortunately, each type of connection has its own deficiency in relation to increased cost and/or unreliability.

BRIEF SUMMARY

The connection discussed herein addresses the needs discussed above, identified below and those that are known in the art. The physical and electrical connection between a flex circuit and rigid circuit board may be made with solder paste having a rivet configuration. In particular, the flex circuit may have conductive pads which will be electrically connected to conductive pads formed on the rigid circuit board. The conductive pads of the flex circuit and/or rigid circuit board may be formed with relief vents. The relief vents may be a through hole extending through the conductive pads and the respective flex circuit and/or rigid circuit board. Solder paste may be disposed between the conductive pads of the flex circuit and the rigid circuit board. When the conductive pad of the flex circuit is pushed toward the conductive pad of the rigid circuit board, the solder paste is displaced through the relief vents of the flex circuit and/or the rigid circuit board. Solder paste is disposed on the exterior side of the flex circuit and/or the rigid circuit board. The solder paste is also disposed in the relief vents and between the conductive pads. After the solder paste is flowed, the solder paste disposed on the exterior side of the flex circuit and/or the rigid circuit board forms rivet heads. These rivet heads are joined or attached to each other via the flowed solder past in the relief vents and between the conductive pads. The rivet heads sandwich the flex circuit and rigid circuit board and secures the flex circuit to the rigid circuit board.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 4:
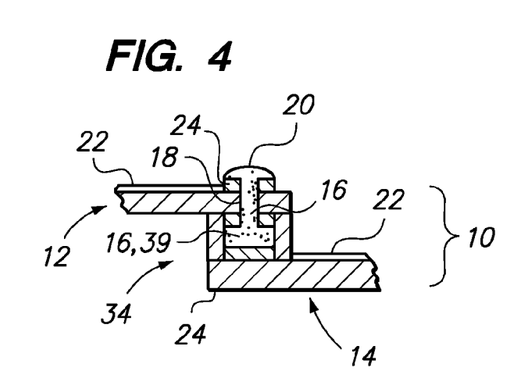
FIG. 4 is an assembled view of FIG. 2.
Figure 5:
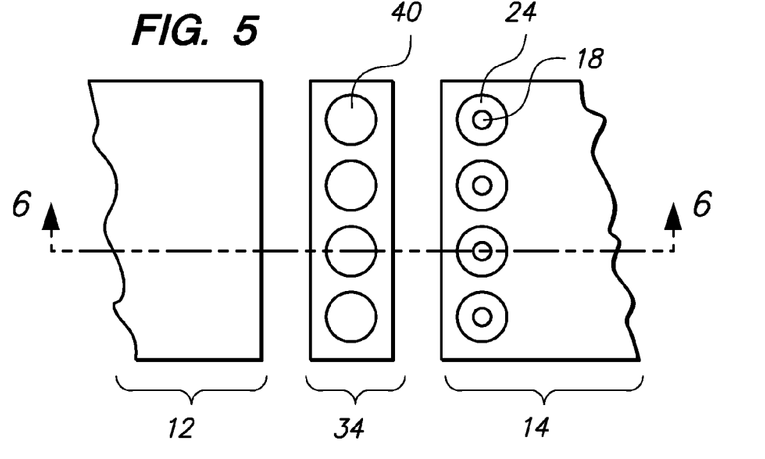
FIG. 5 is a top exploded view of a flex circuit, spacer and rigid circuit board with relief vent.

Referring now to the figures which are for the purposes of illustrating preferred embodiments of a connection 10 (see FIG. 4) between a flex circuit 12 and a rigid circuit board 14, FIG. 4 illustrates solder paste 16 displaced through a relief vent 18 for preventing solder paste 16 from contacting adjacent conductive pads 24. In particular, the relief vent 18 controls the flow of solder paste 16 disposed between respective conductive pads 24 of the flex circuit 12 and the rigid circuit board 14 during assembly of the rigid circuit board 14 and the flex circuit 12 such that the solder paste 16 does not squeeze out toward and contact adjacent conductive pads 24. Moreover, the solder paste 16 displaced through the relief vent 18 assists in physically attaching the flex circuit 12 to the rigid circuit board 14 by forming a rivet head 20 that attaches the flex circuit 12 to the rigid circuit board 14.

Figure 1:
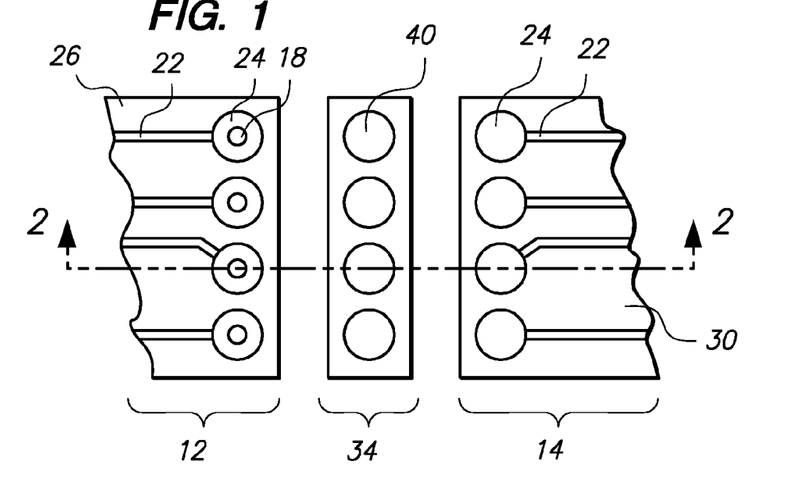
FIG. 1 is a top exploded view of a flex circuit with relief vent, spacer and rigid circuit board.
Figure 2:
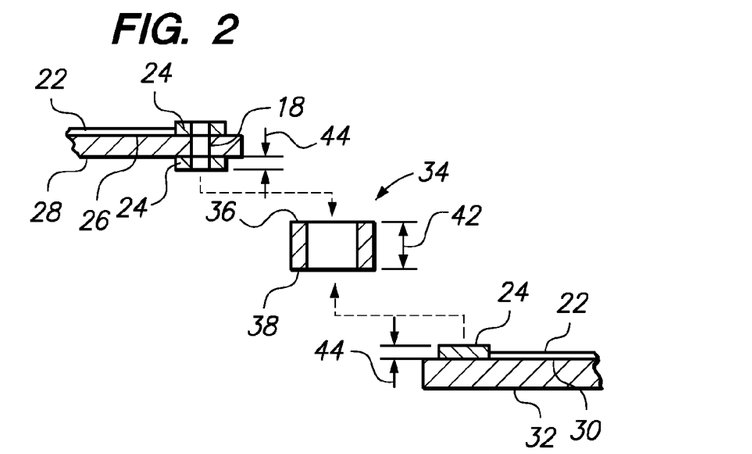
FIG. 2 is a front cross-sectional view of FIG. 1.
Figure 3:
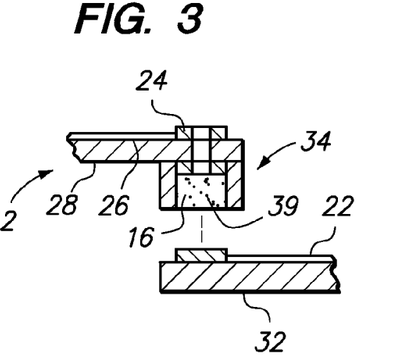
FIG. 3 is a partially assembled view of FIG. 2.

The flex circuit 12 may have a plurality of conductive traces 22 and a plurality of conductive pads 24, as shown in FIG. 1. A first set of conductive pads 24 of the flex circuit 12 may be electrically connected to a second set of conductive pads 24 of the flex circuit 12 through conductive traces 22 or through other electrical communication means. The conductive pads 24 of the flex circuit 12 may be electrically connected to conductive pads 24 formed on the rigid circuit board 14. For example, as shown in FIG. 1, one or more conductive pads 24 may be formed on an upper surface 26 (see FIG. 2) of the flex circuit 12. Also, a respective number of conductive pads 24 may be formed on a lower surface 28 (see FIG. 2) of the flex circuit 12. The conductive pads 24 formed on the upper and lower surfaces 26, 28 of the flex circuit 12 may be aligned to each other, as shown in FIG. 3. A relief vent 18 may be formed through aligned conductive pads 24 of the flex circuit 12, as shown in FIG. 2.

The circuit of the rigid circuit board 14 may include a plurality of conductive pads 24, electrically operative components and conductive traces 22. The rigid circuit board 14 may define an upper surface 30 and a lower surface 32, as shown in FIG. 2. The conductive pads 24 of the rigid circuit board 14 may be formed on the upper surface 30 of the rigid circuit board 14, as shown in FIG. 2. The conductive pads 24 of the rigid circuit board 14 may be electrically connected to the conductive pads 24 of the flex circuit 12. The conductive pads 24 of the rigid circuit board 14 may be in electrical communication with other conductive pads 24 formed on the rigid circuit board 14 and the electrically operative components via conductive traces 22 or through other electrical communication means.

To physically attach the flex circuit 12 to the rigid circuit board 14, a spacer 34 with adhesive applied to an upper surface 36 (see FIG. 2) and a lower surface 38 (see FIG. 2) of the spacer 34 may be disposed between the flex circuit 12 and the rigid circuit board 14 to initially hold the flex circuit 12 to the rigid circuit board 14. More particularly, the spacer 34 may be disposed below the conductive pads 24 formed on the flex circuit 12, as shown in FIG. 3. The adhesive applied to the upper surface 36 of the spacer 34 contacts the lower surface 28 of the flex circuit 12. As such, the spacer 34 is physically attached to the flex circuit 12 via the adhesive. The spacer 34 and the flex circuit 12 forms a cavity 39 for receiving solder paste 16, as shown in FIG. 3. The solder paste 16 is used to electrically connect the conductive pads 24 of the flex circuit 12 to the conductive pads 24 of the rigid circuit board 14. A sufficient amount of solder paste 16 may be disposed within the cavity 39 such that when the conductive pads 24 of the rigid circuit board 14 is inserted into the cavity 39 (see FIG. 4), the solder paste 16 will be displaced out of the relief vent 18. The conductive pads 24 of the rigid circuit board 14 are alignable to the conductive pads 24 of the flex circuit 12, as shown in FIG. 3. Also, the rigid circuit board 14 is adhered to the spacer 34, as shown in FIG. 4. In particular, the adhesive applied to the lower surface 38 of the spacer 34 is attached to the upper surface 30 of the rigid circuit board 14. At this point, the solder paste 16 is displaced through the relief vent 18. The flex circuit 12, spacer 34 and rigid circuit board 14 are adhesively bonded to each other via heat and pressure. Thereafter, the solder paste 16 is subsequently reflowed. The solder paste 16 flowed through the relief vent 18 forms a rivet head 20 (see FIG. 4) above the conductive pads 24 of the flex circuit 12 which secures the flex circuit 12 to the rigid circuit board 14. Also, the solder paste 16 does not contact adjacent conductive pads 24 of the flex circuit 12 or the rigid circuit board 14 thereby preventing or mitigating short circuits.

The spacer 34 may have a rectangular configuration with a plurality of apertures 40, as shown in FIG. 1. The plurality of apertures 40 may be sized, configured and positioned to mate with the conductive pads 24 of the flex circuit 12 and the rigid circuit board 14. The spacer 34 may be thicker than a thickness of the conductive pad 24 of the flex circuit 12. Adhesive may be applied to the upper surface 36 and the lower surface 38 of the spacer 34 which may be used to physically connect the flex circuit 12 to the rigid circuit board 14. For example, the conductive pads 24 of the flex circuit 12 may be received into the apertures 40 of the spacer 34, as shown in FIG. 3. The adhesive applied to the upper surface 36 of the spacer 34 attaches the spacer 34 to the flex circuit 12. The conductive pads 24 of the rigid circuit board 14 may also be received into respective apertures 40 of the spacer 34. The depth 42 (see FIG. 2) of the aperture 40 (see FIG. 1) may be greater than the sum of the thickness 44 of the respective conductive pads 24 such that a sufficient amount of solder paste 16 is still disposed between the respective conductive pads 24 when the conductive pads 24 of the flex circuit 12 and rigid circuit board 14 are received into the spacer apertures 40.

The solder paste 16 may be disposed within the cavity 39 formed by the flex circuit 12 and the spacer 34. The conductive pad 24 of the rigid circuit board 14 is aligned to the cavity 39 (see FIG. 3) and inserted therein (see FIG. 4). The conductive pad 24 of the rigid circuit board 14 pushes or displaces the solder paste 16 through the relief vent 18. The conductive paste flows out through the relief vent 18 and onto an exterior side of the flex circuit 12.

After the conductive pad of the rigid circuit board 14 is received into the cavity, the adhesive on the upper and lower surfaces 36, 38 of the spacer 34 is cured with heat and pressure so as to physically connect the flex circuit 12 to the rigid circuit board 14.

After the adhesive is cured, the solder paste 16 is reflowed. Once the solder paste 16 is reflowed, the solder paste 16 electrically connects the conductive pads 24 of the flex circuit 12 and the rigid circuit board 14.

Additionally, once the solder paste 16 is reflowed, the solder paste 16 forms a rivet-like structure 20 which attaches the flex circuit 12 to the rigid circuit board 14. In particular, the solder paste 16 that was displaced through the relief vent 18 forms a nub or rivet head 20 on top of the flex circuit 12 (i.e., upper surface of conductive pad). After the solder paste 16 is reflowed, the rivet head configured solder paste 16 and the solder paste 16 within the cavity 39 are unitarily joined to each other via the solder paste 16 within the relief vent 18. This structure physically attaches the flex circuit 12 to the rigid circuit board 14. Also, this structure provides an electrical connection between the conductive pad of the flex circuit 12 and the conductive pad of the rigid circuit board 14. In sum, the electrical connection between the conductive pads 24 of the flex circuit 12 and the rigid circuit board 14 is completed by the solder paste 16. The physical connection between the flex circuit 12 and the rigid circuit board 14 is completed by both (1) the adhesive of the spacer 34 and (2) the reflowed solder paste 16 having a rivet configuration.

Referring now to FIGS. 5-8, a flex circuit 12 may be attached to a rigid circuit board 14 in a similar manner compared to the discussion above in relation to FIGS. 1-4. The flex circuit 12 may have a plurality of conductive pads 24 (see FIG. 6) formed on a lower surface 28 of the flex circuit 12. The conductive pads 24 may be electrically connected to other conductive pads 24 via conductive traces 22 which are also formed on the lower or upper surface 26, 28 of the flex circuit 12. The flex circuit 12 may be physically connected to the rigid circuit board 14 via the spacer 34 with adhesive applied to the upper surface 36 and lower surface 38 of the spacer 34. The rigid circuit board 14 may have a plurality of conductive pads 24 formed on lower and upper surfaces 30, 32 of the rigid circuit board 14 which may be aligned, sized and configured to be electrically connected to the conductive pads 24 formed on the flex circuit 12. The conductive pads 24 formed on the rigid circuit board 14 may have a through hole/relief vent 18 (see FIG. 6) formed through the conductive pad 24 and the rigid circuit board 14 such that solder paste 16 may be displaced through the relief vent 18 in a similar manner as discussed above in relation to FIGS. 1-4. The conductive pads 24 formed on the rigid circuit board 14 may be electrically connected to electrical components or other conductive pads 24 of the rigid circuit board 14 via conductive traces 22.

To physically connect the flex circuit 12 to the rigid circuit board 14, the spacer 34 may be attached to the lower surface 28 of the flex circuit 12. The spacer 34 having a plurality of apertures 40 may receive the conductive pads 24 formed on the flex circuit 12. The adhesive applied to the upper surface 36 of the spacer 34 may be adhered to the lower surface 28 of the flex circuit 12 to position and maintain the position of the spacer 34 in relation to the flex circuit 12 during assembly. Solder paste 16 may be disposed within the cavity 39 formed by the flex circuit 12 and the spacer 34 (see FIG. 7).

Figure 8:
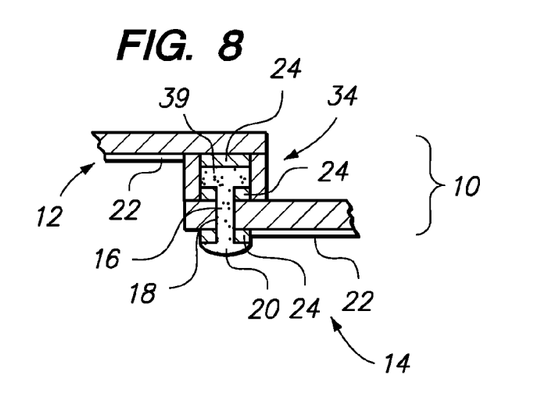
FIG. 8 is an assembled view of FIG. 6.

The conductive pads 24 of the rigid circuit board 14 are aligned to the cavities 39 (see FIG. 7) and inserted into the cavities 39 (see FIG. 8). The adhesive applied to the lower surface 38 of the spacer 34 attaches the flex circuit 12 to the rigid circuit board 14. Also, solder paste 16 in the cavity is displaced through the relief vent 18 formed in the rigid circuit board 14 and preferably forms a nub or rivet head 20 (see FIG. 8) on the bottom surface of the rigid circuit board 14.

After the flex circuit 12, spacer 34 and rigid circuit board 14 are assembled, the adhesive of the spacer 34 is cured with heat and pressure to bond the flex circuit 12 to the rigid circuit board 14. After the flex circuit 12 is physically attached to the rigid circuit board 14 via the spacer 34, the solder paste 16 may be reflowed. The reflowed solder paste 16 electrically connects the conductive pads 24 of the flex circuit 12 and the rigid circuit board 14. Also, the solder paste 16 displaced through the relief vent 18 of the rigid circuit board 14 forms a nub/rivet head 20 on an exterior side of the rigid circuit board 14. As a result, the reflowed solder paste 16 forms a rivet configuration which secures the rigid circuit board 14 to the flex circuit 12.

Figure 9:
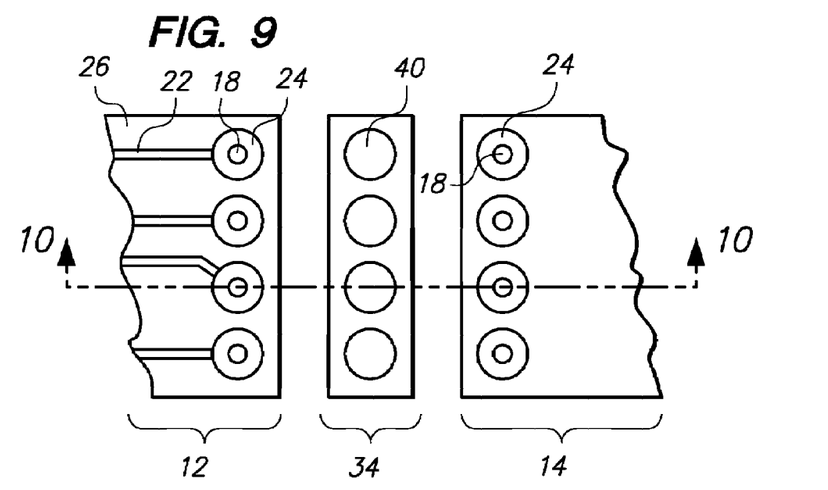
FIG. 9 is a top exploded view of a flex circuit with relief vent, spacer, rigid circuit board with relief vent.
Figure 10:
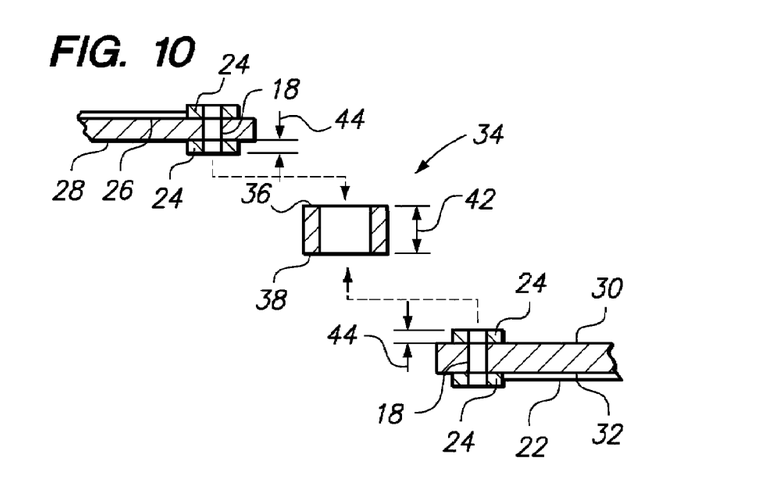
FIG. 10 is a front cross-sectional view of FIG. 9.

Referring now to FIGS. 9-12, the flex circuit 12 may be physically and electrically attached to the rigid circuit board 14 in a similar manner as discussed in relation to FIGS. 1-8. As shown in FIG. 9, conductive pads 24 may be formed on the flex circuit 12. For example, conductive pads 24 may be formed on the upper and lower surfaces 26, 28 of the flex circuit 12, as shown in FIG. 10. Also, conductive pads 24 may be formed on the upper and lower surfaces 30, 32 of the rigid circuit board 14. The conductive pads 24 formed on the flex circuit 12 may be sized, configured and positioned to be electrically connectable to the conductive pads 24 of the rigid circuit board 14. The conductive pads 24 formed on the flex circuit 12 and the rigid circuit board 14 may have relief vents 18 formed therethrough for allowing solder paste 16 to be displaced through the relief vent 18 to prevent short circuits and to form rivet heads 20 and physically attach the flex circuit 12 and the rigid circuit board to each other.

The flex circuit 12 and the rigid circuit board 14 may have additional conductive pads 24 and/or electrically operative components. These additional conductive pads 24 and electrically operative components may be electrically communicable with the conductive pads 24 shown in FIGS. 9-12 via conductive traces 22 or other electrical communication means.

Figure 11:
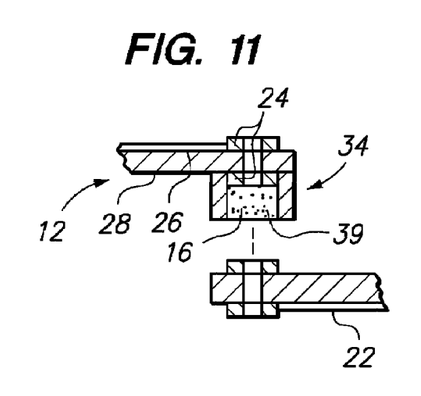
FIG. 11 is a partially assembled view of FIG. 10.
Figure 12:
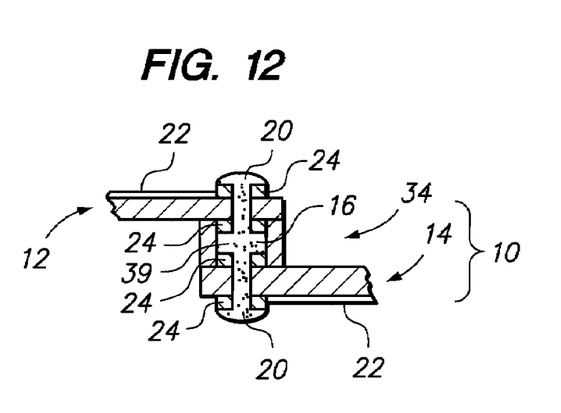
FIG. 12 is an assembled view of FIG. 10.

To assemble the flex circuit 12 and the rigid circuit board 14, the spacer 34 may be adhered to the lower surface 28 of the flex circuit 12, as shown in FIG. 11. The spacer 34 may have a plurality of apertures 40 which are sized and configured to receive the conductive pads 24 formed on the lower surface 28 of the flex circuit 12. The spacer 34 and the flex circuit 12 forms cavities 39 which may be filled with solder paste 16. After the solder paste 16 is filled in the cavity 39, the rigid circuit board 14 is attached to the flex circuit 12 via the spacer 34. More particularly, the adhesive applied to the lower surface 38 of the spacer 34 is adhered to the upper surface 30 of the rigid circuit board 14. Since the conductive pads 24 of the rigid circuit board 14 are inserted into the cavities 39, the solder paste 16 is displaced out of the cavities 39 and through the relief vents 18 of the flex circuit 12 and also the rigid circuit board 14. Preferably, a sufficient amount of solder paste 16 is disposed within the cavity such that the solder paste 16 is displaced through the relief vent 18 and onto the conductive pad 24 of the flex circuit 12 and the rigid circuit board 14. The adhesive of the spacer 34 is cured with heat and pressure which adhesively bonds the flex circuit 12 to the rigid circuit board 14. Thereafter, the solder paste 16 is re-flowed. Once the solder paste 16 is re-flowed, the solder paste 16 forms a rivet-like structure 20 which physically attaches the flex circuit 12 and the rigid circuit board 14 to each other. The upper surface of the flex circuit's conductive pad has a rivet head 20. The lower surface of the rigid circuit board's conductive pad has a rivet head 20. The rivet heads 20 are unitarily connected to each other via reflowed solder paste 16 within the relief vents 18 of the flex circuit 12 and the rigid circuit board 14 as well as the cavities 39. Since the solder paste 16 is a unitary structure, the rivet head/nubs 20 hold the flex circuit 12 and the rigid circuit board 14 together. The reflowed solder paste 16 attaches the flex circuit 12 to the rigid circuit board 14 in a similar fashion that a rivet secures two plates together. Also, the reflowed solder paste 16 provides the electrical communication path between the conductive pads 24 formed on the flex circuit 12 and the conductive pads 24 formed on the rigid circuit board 14.

Figure 6:
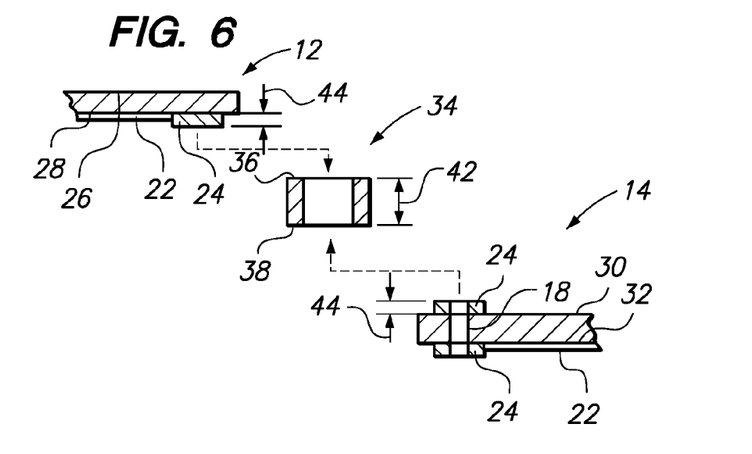
FIG. 6 is a front cross-sectional view of FIG. 5.
Figure 7:
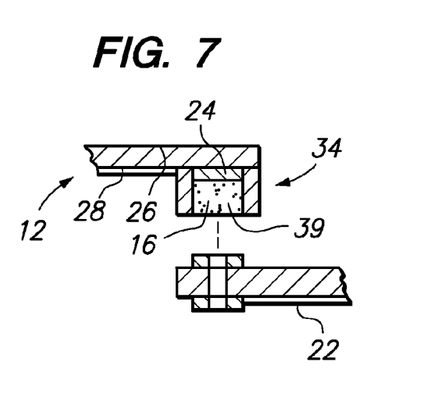
FIG. 7 is a partially assembled view of FIG. 6.

In an aspect of the connection 10 between the flex circuit 12 and the rigid circuit board 14, it is contemplated that the relief vents 18 may be plated. For example, as shown in FIGS. 2 and 10, conductive pads 24 are aligned and formed on the upper and lower surfaces 26, 28 of the flex circuit 12. A relief vent 18 is formed through the conductive pads 24. The relief vent 18 may be plated so as to electrically connect the conductive pads 24 on the upper and lower surfaces 26,28 of the flex circuit 12. In another example, conductive pads 24 are aligned and formed on the upper and lower surfaces 30, 32 of the rigid circuit board 14, as shown in FIGS. 6 and 10. A relief vent 28 is formed through the conductive pads 24. The relief vent 18 may be plated so as to electrically connect the conductive pads 24. In another example, the conductive pad may be formed only on the upper surface 26 or the lower surface 28 of the flex circuit 12 or rigid circuit board 14. For example, FIG. 2 illustrates a conductive pad formed only on the upper surface 30 of the rigid circuit board 14. A relief vent 18 may be formed through the conductive pad 24 and the rigid circuit board 14. The relief vent 19 may be plated.

In an aspect of the connection between the flex circuit 12 and the rigid circuit board 14, it is also contemplated that the connection may be used to electrically connect and physically attach two or more flex circuits 12 to form a longer flex circuit. For example, the flex circuit 12 shown in FIGS. 1-12 may be referred to as an upper flex circuit 12, and the rigid circuit board 14 shown in FIGS. 1-12 may be replaced with a flex circuit, hereinafter referred to as a lower flex circuit. The upper and lower flex circuits may be formed with conductive pads 24 with relief vents 18 to allow excessive solder paste 18 to be displaced through the relief vents 18. Alternatively, the upper flex circuit 12 may be formed with conductive pads 24 with relief vents 18 to allow excessive solder paste 16 to be displaced through the relief vents 18. As a further alternative, it is also contemplated that the lower flex circuit may be formed with conductive pads 24 with relief vents 18 to allow excessive solder paste 18 to be displaced through the relief vents 18.

Additional flex circuits may be electrically connected and physically attached to the lower flex circuit, as discussed herein, to increase the length of the flex circuit. For example, a third flex circuit may be electrically connected and physically attached to the top side of the lower flex circuit, and a fourth flex circuit may be electrically connected and physically attached to the bottom side of the third flex circuit. Additional flex circuits may be electrically connected and physically attached to the fourth flex circuit following the same top to bottom pattern. Alternatively, a third flex circuit may be attached to the bottom side of the lower flex circuit, and a fourth flex circuit may be attached to the bottom side of the third flex circuit. Additional flex circuits may be electrically connected and physically attached to the fourth flex circuit following the same bottom to bottom pattern.

In another aspect, the spacer 34 discussed above may be adhesive-free. To assemble the flex circuit 12 to the rigid circuit board 14, the spacer 34 is disposed on the flex circuit 12 with the conductive pads 24 inserted into the apertures 40 of the spacer 34. Solder paste 16 is disposed within the cavity formed by the spacer 34 and the flex circuit 12, or in the alternative, solder paste 16 is disposed on the conductive pad 24 of the rigid circuit board 14. Before the solder paste is flowed, the flex circuit 12, spacer 34 and rigid circuit board 14 are not adhesively attached to each other. The flex circuit 12 becomes attached to the rigid circuit board 14 after the solder paste 16 is flowed.

In another aspect of the connection 10, the flex circuit 12, upper rigid circuit board or upper flex circuit may be physically and electrically connected to the rigid circuit board 14, lower rigid circuit board and the lower flex circuit at any position (e.g., central portion, lateral portion, distal portion, proximal portion, etc.). Also, the rigid circuit board 14, lower flex circuit or lower rigid circuit board may be physically and electrically connected to the flex circuit 12, upper rigid circuit board or upper flex circuit at any position (e.g., central portion, lateral portion, distal portion, proximal portion, etc.).

In another aspect of the connection 10, the flex circuit 12, upper rigid circuit board or upper flex circuit may have any combination of conductive pads 24. By way of example and not limitation, as shown in FIG. 2, the flex circuit 12 has conductive pads 24 formed on its upper surface 26 and lower surface 28. However, it is contemplated that the flex circuit 12 may have conductive pads 24 formed only on its upper surface 26 or formed only on its lower surface 28. It is also contemplated that the rigid circuit board 14 may have conductive pads 24 formed on both the upper and lower surfaces 30, 32 of the rigid circuit board 14. It is also contemplated that the conductive pads 24 may be formed only on the lower surface 32 of the rigid circuit board 14 or only on the upper surface 30 of the rigid circuit board. In relation to the connection illustrated in FIGS. 9-12, the conductive pads 24 formed on the flex circuit 12 may be formed on the upper surface, lower surface, or as shown, on both the upper and lower surfaces. Similarly, the conductive pads 24 formed on the rigid circuit board 14 may be formed on the upper surface, lower surface, or, as shown, both the upper and lower surfaces.

Figure 13:
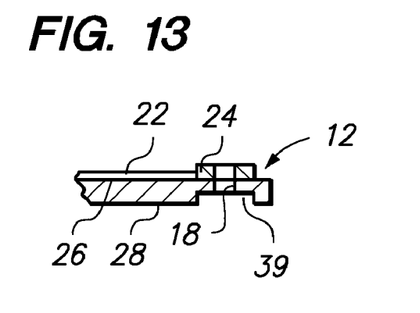
FIG. 13 is a front cross sectional view of a flex circuit with an integral depression for receiving solder paste.
Figure 14:
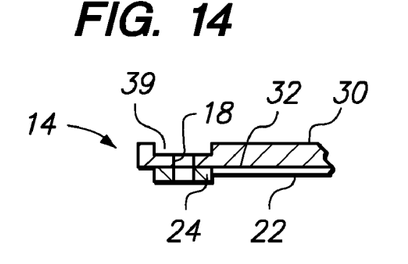
FIG. 14 is a front cross sectional view of a rigid circuit board with an integral depression for receiving solder paste.

In an another aspect of the connection 10 between the flex circuit 12 and the rigid circuit board 14, the spacer 34 may be made integral with the flex circuit 12 or the rigid circuit board 14, as shown in FIGS. 13 and 14. For example, as shown in FIG. 13, the flex circuit 12 may have conductive pads 24 formed on the upper surface 26 of the flex circuit 12. A plurality of cavities 39 may be formed on the lower surface 28 of the flex circuit 12. The cavities 39 may be sized, configured and positioned to receive the conductive pads 24 formed on the rigid circuit board 14.

Alternatively, as shown in FIG. 14, the rigid circuit board 14 may have conductive pads 24 formed on the lower surface 32 of the rigid circuit board 14. A plurality of cavities 39 may be formed on the upper surface 30 of the rigid circuit board 14. The cavities 39 may be sized, configured and positioned to receive the conductive pads 24 formed on the flex circuit 12.

In another aspect of the connection 10 between the flex circuit 12 and the rigid circuit board 14, the spacer 34 may initially be attached or disposed on the rigid circuit board 14 instead of the flex circuit 12. In this situation, the spacer 34 and the rigid circuit board 14 forms the cavity 39 in which solder paste 16 may be disposed prior to attachment of the flex circuit 12 to the rigid circuit board 14.

Figure 15:
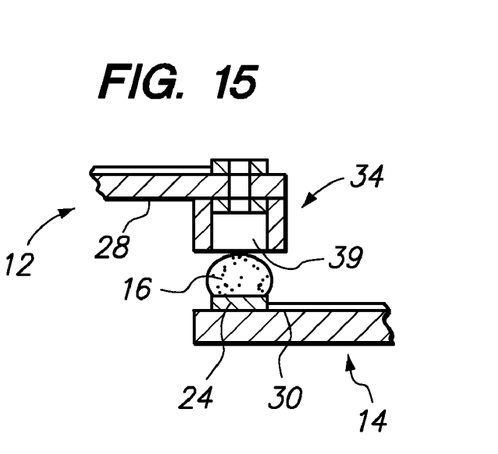
FIG. 15 is a partially assembled view of FIG. 2 with solder paste disposed on the rigid circuit board.
Figure 16:
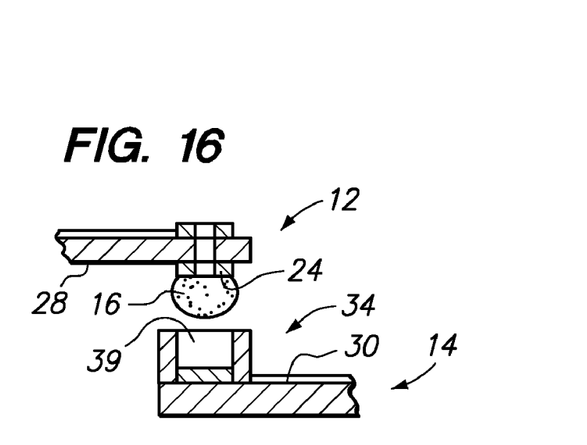
FIG. 16 is a partially assembled view of FIG. 2 with a spacer attached to the rigid circuit board and the solder paste disposed on the flex circuit.

In another aspect of the connection 10 between the flex circuit 12 and the rigid circuit board 14, the solder paste 16 may be disposed on the conductive pad 24 opposite the cavity 39 in relation to the embodiments discussed above. By way of example and not limitation, as shown in FIG. 15, if the spacer 34 is attached to the lower surface 28 of the flex circuit 12 such that the cavity 39 is formed by the spacer 34 and the flex circuit 12, the solder paste 16 may be disposed on the conductive pad 24 of the rigid circuit board 14 or on the upper surface 30 of the rigid circuit board 14 instead of within the cavity 39. Alternatively, as shown in FIG. 16, if the spacer 34 is attached to the upper surface 30 of the rigid circuit board 14 such that the cavity 39 is formed by the spacer 34 and the rigid circuit board 14, the solder paste 16 may be disposed on the conductive pad 24 of the flex circuit 12 or on the lower surface 28 of the flex circuit 12 instead of within the cavity 39.

The orientations shown in the figures are not meant to limit but are for convenience. For example, in FIG. 16, the solder paste is shown as being positioned above the cavity 39. However, it is contemplated that the assembly shown in FIG. 16 may be reversed such that the rigid circuit board is above the flex circuit and the solder paste is now positioned below the cavity 39.

The above description is given by way of example, and not limitation. Given the above disclosure, one skilled in the art could devise variations that are within the scope and spirit of the invention disclosed herein. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. An interconnection between circuits, the interconnection comprising:

a first circuit defining a first surface and a second surface, the first circuit having at least one conductive pad, a relief vent formed through the first circuit conductive pad extending between the first and second surfaces of the first circuit;

a spacer defining first and second surfaces, the spacer having at least one aperture alignable to the relief vent of the first circuit;

a second circuit defining a first surface and a second surface, the second circuit having at least one conductive pad, a relief vent formed through the second circuit conductive pad extending between the first and second surfaces of the second circuit, the relief vent of the second circuit being alignable to the aperture of the spacer;

solder paste disposed within the aperture of the spacer and between the first and second circuits, the solder paste disposed within the relief vents of the first and second circuits;

wherein the first circuit is a flex circuit and the second circuit is a rigid circuit board.

2. An interconnection between circuits, the interconnection comprising:

a first circuit defining a first surface and a second surface, the first circuit having at least one conductive pad, a relief vent formed through the first circuit conductive pad extending between the first and second surfaces of the first circuit;

a spacer defining first and second surfaces, the spacer having at least one aperture alignable to the relief vent of the first circuit;

a second circuit defining a first surface and a second surface, the second circuit having at least one conductive pad, a relief vent formed through the second circuit conductive pad extending between the first and second surfaces of the second circuit, the relief vent of the second circuit being alignable to the aperture of the spacer;

solder paste disposed within the aperture of the spacer and between the first and second circuits, the solder paste disposed within the relief vents of the first and second circuits;

wherein the first and second circuits are flex circuits.

3. The interconnection of claim 2 wherein the first circuit is an upper circuit, and the second circuit is a lower circuit, and solder paste is displaced through the relief vents of the upper and lower circuits and disposed above the upper circuit and below the lower circuit.

4. The interconnection of claim 2 wherein the spacer and the first circuit are integrally formed of a unitary material.

5. The interconnection of claim 2 wherein the spacer and the second circuit are integrally formed of a unitary material.

6. The interconnection of claim 2 wherein the aperture of the spacer is larger than the relief vents of the first and second circuits, the solder paste is physically disposed between the second surface of the first circuit and the first surface of the second circuit.

7. The interconnection of claim 6 wherein an inner periphery of the spacer circumscribes an outer periphery of the conductive pad.

8. An interconnection between circuits, the interconnection comprising:

a first circuit defining a first surface and a second surface, the first circuit having at least one conductive pad;

a second circuit defining a first surface and a second surface, the second circuit having at least one conductive pad, a relief vent formed through the second circuit conductive pad extending between the first and second surfaces of the second circuit;

a spacer defining first and second surfaces, the spacer having at least one aperture aligned to the relief vent of the second circuit;

solder paste disposed within the aperture of the spacer and between the first and second circuits, the solder paste disposed within the relief vent of the second circuit;

wherein the first circuit is a flex circuit and the second circuit is a rigid circuit board.

9. An interconnection between circuits, the interconnection comprising:

a first circuit defining a first surface and a second surface, the first circuit having at least one conductive pad;

a second circuit defining a first surface and a second surface, the second circuit having at least one conductive pad, a relief vent formed through the second circuit conductive pad extending between the first and second surfaces of the second circuit;

a spacer defining first and second surfaces, the spacer having at least one aperture aligned to the relief vent of the second circuit;

solder paste disposed within the aperture of the spacer and between the first and second circuits, the solder paste disposed within the relief vent of the second circuit;

wherein the first and second circuits are flex circuits.

10. The interconnection of claim 9 wherein the first circuit is an upper circuit, the second circuit is a lower circuit, and solder paste is displaced through the relief vent of the lower circuit and disposed below the lower circuit.

11. The interconnection of claim 9 wherein the spacer and the first circuit are integrally formed of a unitary material.

12. The interconnection of claim 9 wherein the spacer and the second circuit are integrally formed of a unitary material.

13. An interconnection between circuits, the interconnection comprising:

a lower circuit defining a lower surface and an upper surface, the lower circuit having at least one conductive pad;

an upper circuit defining a lower surface and an upper surface, the upper circuit having at least one conductive pad, a relief vent formed through the upper circuit conductive pad extending between the upper and lower surfaces of the upper circuit;

a spacer defining upper and lower surfaces, the spacer having at least one aperture aligned to the relief vent of the upper circuit;

solder paste disposed within the aperture of the spacer and between the upper and lower circuits, the solder paste disposed within the relief vent of the upper circuit;

wherein the upper circuit is a flex circuit and the lower circuit is a rigid circuit board.

14. An interconnection between circuits, the interconnection comprising:

a lower circuit defining a lower surface and an upper surface, the lower circuit having at least one conductive pad;

an upper circuit defining a lower surface and an upper surface, the upper circuit having at least one conductive pad, a relief vent formed through the upper circuit conductive pad extending between the upper and lower surfaces of the upper circuit;

a spacer defining upper and lower surfaces, the spacer having at least one aperture aligned to the relief vent of the upper circuit;

solder paste disposed within the aperture of the spacer and between the upper and lower circuits, the solder paste disposed within the relief vent of the upper circuit;

wherein the upper and lower circuits are flex circuits.

15. The interconnection of claim 14 wherein solder paste is displaced through the relief vent of the upper circuit and disposed above the upper circuit.

16. The interconnection of claim 14 wherein the spacer and the upper circuit are integrally formed of a unitary material.

17. The interconnection of claim 14 wherein the spacer and the lower circuit are integrally formed of a unitary material.

18. An interconnection between circuits, the interconnection comprising:

a first circuit defining a first surface and a second surface, the first circuit having at least one conductive pad, a relief vent formed through the first circuit conductive pad extending between the first and second surfaces of the first circuit;

a spacer defining first and second surfaces, the spacer having at least one aperture alignable to the relief vent of the first circuit;

a second circuit defining a first surface and a second surface, the second circuit having at least one conductive pad, a relief vent formed through the second circuit conductive pad extending between the first and second surfaces of the second circuit, the relief vent of the second circuit being alignable to the aperture of the spacer;

solder paste disposed within the aperture of the spacer and between the first and second circuits, the solder paste disposed within the relief vents of the first and second circuits;

wherein only the solder paste is disposed within the relief vents.

19. An interconnection between circuits, the interconnection comprising:

a first circuit defining a first surface and a second surface, the first circuit having at least one conductive pad, a relief vent formed through the first circuit conductive pad extending between the first and second surfaces of the first circuit;

a spacer defining first and second surfaces, the spacer having at least one aperture alignable to the relief vent of the first circuit;

a second circuit defining a first surface and a second surface, the second circuit having at least one conductive pad, a relief vent formed through the second circuit conductive pad extending between the first and second surfaces of the second circuit, the relief vent of the second circuit being alignable to the aperture of the spacer;

solder paste disposed within the aperture of the spacer and between the first and second circuits, the solder paste disposed within the relief vents of the first and second circuits;

wherein the solder paste disposed above and below the first and second circuits form rivet heads.

20. An interconnection between circuits, the interconnection comprising:

a first circuit defining a first surface and a second surface, the first circuit having at least one conductive pad, a relief vent formed through the first circuit conductive pad extending between the first and second surfaces of the first circuit;

a spacer defining first and second surfaces, the spacer having at least one aperture alignable to the relief vent of the first circuit;

a second circuit defining a first surface and a second surface, the second circuit having at least one conductive pad, a relief vent formed through the second circuit conductive pad extending between the first and second surfaces of the second circuit, the relief vent of the second circuit being alignable to the aperture of the spacer;

solder paste disposed within the aperture of the spacer and between the first and second circuits, the solder paste disposed within the relief vents of the first and second circuits;

wherein the conductive pads of the first and second circuits are formed on end portions of the first and second circuits, the first and second circuits overlapping in contact with one another only at the end portions of the first and second circuits.

21. A method of interconnecting first and second circuits, the method comprising the steps of:

placing a spacer on a first circuit;

aligning a relief vent of a second circuit to an aperture of the spacer;

disposing solder paste within the aperture of the spacer;

stacking the second circuit on the spacer and the first circuit;

during the stacking step, displacing the solder paste through the relief vent and out of the relief vent external to the second circuit to form a rivet head.

22. The method of claim 21 wherein the displacing step includes pushing the solder paste out of the relief vent due to stacking the second circuit on the spacer and the first circuit.

23. The method of claim 21 further comprising the step of:

during the stacking step, displacing the solder paste through a relief vent formed in the first circuit and out of the relief vent external to the first circuit to form a rivet head.

* * * * *